(12) United States Patent
Nakagawa

(10) Patent No.: US 7,814,648 B2
(45) Date of Patent: Oct. 19, 2010

(54) METHOD OF DISPOSING AN ELECTRONIC DEVICE ON AN ELECTRODE FORMED ON SUBSTRATE

(75) Inventor: Tohru Nakagawa, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/761,911

(22) Filed: Apr. 16, 2010

(65) Prior Publication Data

US 2010/0192372 A1 Aug. 5, 2010

Related U.S. Application Data

(63) Continuation of application No. PCT/JP2009/005456, filed on Oct. 19, 2009.

(30) Foreign Application Priority Data

Nov. 26, 2008 (JP) .............................. 2008-300481

(51) Int. Cl.
*H05K 3/30* (2006.01)

(52) U.S. Cl. ............................. 29/832; 29/831; 29/842; 29/846; 427/97.3; 438/678

(58) Field of Classification Search .................. 29/831, 29/832, 834, 842, 846; 101/465; 427/97.3, 427/97.4, 98.4, 273, 430.1; 438/99, 107, 438/377, 678

See application file for complete search history.

(56) References Cited

U.S. PATENT DOCUMENTS 5,079,600 A * 1/1992 Schnur et al. ................ 438/669

(Continued)

FOREIGN PATENT DOCUMENTS

CN 101310373 11/2008

(Continued)

OTHER PUBLICATIONS

Tohru Nakagawa, et al., "Controlled Deposition of Silicon Nanowires on Chemically Patterned Substrate by Capillary Force Using a Blade-Coating Method", J. Phys. Chem, 2008, No. 112, pp. 5390-5396, American Chemical Society.

(Continued)

*Primary Examiner*—Donghai D. Nguyen
(74) *Attorney, Agent, or Firm*—McDermott Will & Emery LLP

(57) ABSTRACT

The present invention includes: a pre-step of preparing a substrate having on its surface a hydrophilic region that is surrounded by a water-repellent region and provided with a hydrophilic electrode; a first step of applying an electroless plating solution in which a metal compound is dispersed in water to the substrate to dispose an electroless plating solution in the hydrophilic region; a second step of applying an electronic device-dispersed liquid in which an electronic device having a device electrode is dispersed in a first liquid to the substrate to move the electronic device from the first liquid to the electroless plating solution so as to bring the device electrode into contact with the hydrophilic electrode; a third step of coating a surface of the substrate with a second liquid before the water contained in the electroless plating solution volatilizes completely to cause a plating reaction between the hydrophilic electrode and the device electrode and to connect electrically the hydrophilic electrode and the device electrode; and a fourth step of removing the second liquid from the substrate.

14 Claims, 12 Drawing Sheets

U.S. PATENT DOCUMENTS

| | | |
|---|---|---|
| 6,417,025 B1 | 7/2002 | Gengel |
| 6,507,989 B1 | 1/2003 | Bowden et al. |
| 6,872,645 B2 * | 3/2005 | Duan et al. .................. 438/99 |
| 6,969,690 B2 | 11/2005 | Zhou et al. |
| 7,635,500 B2 * | 12/2009 | Nakagawa .................. 427/273 |
| 7,730,610 B2 * | 6/2010 | Nakagawa et al. ............ 29/832 |
| 2005/0164485 A1 | 7/2005 | Onozawa et al. |
| 2007/0161152 A1 | 7/2007 | Onozawa |
| 2008/0260951 A1 | 10/2008 | Nakagawa et al. |
| 2009/0265929 A1 | 10/2009 | Nakagawa et al. |

FOREIGN PATENT DOCUMENTS

| | | |
|---|---|---|
| JP | 09-201794 | 8/1997 |
| JP | 2003-5212 | 1/2003 |
| JP | 2005-209939 | 8/2005 |
| JP | 2005-229042 | 8/2005 |
| JP | 2006-113258 | 4/2006 |
| JP | 2007-37381 | 2/2007 |
| JP | 4149507 | 7/2008 |
| JP | 2008-229489 | 10/2008 |
| JP | 4204641 | 10/2008 |
| KR | 10-2008-0047616 | 5/2008 |
| WO | WO 2007/037381 A1 | 4/2007 |

OTHER PUBLICATIONS

Uthara Srinivasan, et al., "Microstructure to Substrate Self-Assembly Using Capillary Force", Journal of Microelectromechanical Systems, Mar. 2001, vol. 10 No. 01, pp. 17-24, IEEE.

* cited by examiner

PRIOR ART

PRIOR ART

PRIOR ART

PRIOR ART
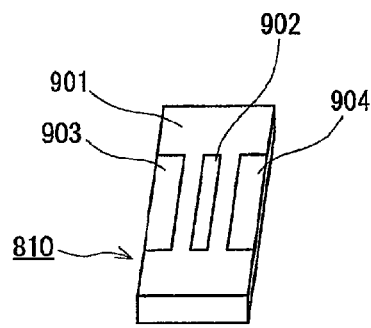
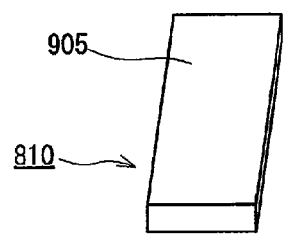
FIG.12A    FIG.12B
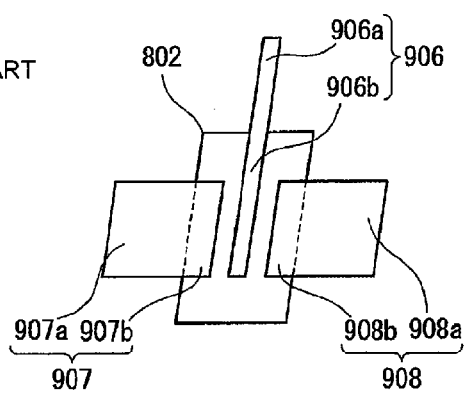
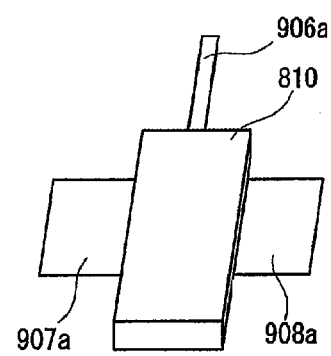
FIG.12C    FIG.12D
PRIOR ART

METHOD OF DISPOSING AN ELECTRONIC DEVICE ON AN ELECTRODE FORMED ON SUBSTRATE

RELATED APPLICATIONS

This application is a Continuation of PCT International Application No. PCT/JP2009/005456, filed on Oct. 19, 2009, claiming priority of Japanese Application No. 2008-300481, filed on Nov. 26, 2008, the disclosures of which Applications are incorporated by reference herein.

BACKGROUND OF THE INVENTION

1. Field of the Invention

The present invention relates to a method of disposing an electronic device on an electrode formed on a substrate to connect electrically the electronic device and the electrode.

2. Description of Related Art

Active-type liquid crystal display devices and organic electroluminescence display devices, in which a plurality of pixels are arranged in a matrix, are formed on glass substrates. Each of these pixels is controlled by a transistor provided in the vicinity of the pixel.

With current technology, however, crystalline semiconductor transistors cannot be formed on a glass substrate. Therefore, thin film transistors for controlling pixels are formed using an amorphous silicon or polysilicon thin film. Such thin film transistors have the advantage that they can be fabricated on a large-area substrate at low cost, but have the disadvantage that their lower mobility than crystalline silicon prevents them from operating at high speed.

To overcome this disadvantage, the present inventor has proposed the following method of disposing transistors on a substrate. In this method, a large number of transistors are fabricated previously on a monocrystalline silicon wafer and then cut into individual pieces from the silicon wafer to be dispersed in a liquid.

Then, the liquid is spread on a substrate so that the transistors are disposed on the substrate (see U.S. patent application Ser. No. 12/088,194, particularly FIG. 34 and FIG. 36). This method makes it possible to form a high-performance transistors composed of crystalline silicon on a glass substrate.

The method described in U.S. patent application Ser. No. 12/088,194 are shown in FIGS. 8A and 8B, FIGS. 9A and 9B, FIGS. 10A to 10C, FIGS. 11A and 11B, and FIGS. 12A to 12D.

FIGS. 8A and 8B, FIGS. 9A and 9B, FIGS. 10A to 10C, and FIGS. 11A and 11B show in this order the steps of the method described in U.S. patent application Ser. No. 12/088,194. FIG. 8B is a cross-sectional view taken along a line I-I of FIG. 8A. FIG. 9B is a cross-sectional view taken along a line II-II of FIG. 9A. FIGS. 10B and 10C are cross-sectional views taken along a line III-III of FIG. 10A and show the time course of the same region, which changes from a state shown in FIG. 10B to a state shown in FIG. 10C with time. FIG. 11B is a cross-sectional view taken along a line IV-IV of FIG. 11A.

FIG. 12A is a schematic diagram of a transistor 810 to be disposed. FIG. 12B is a schematic diagram of the back side of the transistor 810 shown in FIG. 12A. FIG. 12C is a detailed schematic diagram of a hydrophilic region 802 to be formed on a substrate. FIG. 12D is a schematic diagram showing a state in which the transistor 810 is disposed in the hydrophilic region 802.

As shown in FIGS. 8A and 8B, first, a plurality of hydrophilic regions 802 surrounded by a water-repellent region 803 are formed in a matrix on the surface of a substrate 801. To form the water-repellent region 803, a target region is modified chemically with a silane coupling agent containing fluorocarbon chains, such as $CF_3(CF_2)_7C_2H_4SiCl_3$, or a silane coupling agent containing hydrocarbon chains, such as $CH_3(CH_2)_{17}SiCl_3$, so as to be rendered water-repellent. According to the description of U.S. patent application Ser. No. 12/088,194, a person skilled in the art can modify chemically only a target region with a silane coupling agent to render the region water-repellent.

As shown in FIG. 12C, a first electrode 906, a second electrode 907, and a third electrode 908 are formed in and around the hydrophilic region 802. A part of the first electrode 906 is formed in the hydrophilic region 802 and has a hydrophilic surface. This part is referred to as a hydrophilic first electrode 906b. The other part of the first electrode 906 is formed outside the hydrophilic region 802 and has a water-repellent surface. This part is referred to as a water-repellent first electrode 906a. Likewise, the second electrode 907 is composed of a water-repellent second electrode 907a and a hydrophilic second electrode 907b, and the third electrode 908 is composed of a water-repellent third electrode 908a and a hydrophilic third electrode 908b.

A hydrophilic metal or a hydrophilic substrate can be used to form the hydrophilic region 802. Examples of the hydrophilic metal include nickel, aluminum, and copper. Examples of the hydrophilic substrate include a glass substrate, a silicon substrate having an oxide film formed on its surface, and a nylon resin substrate. A metal or a substrate also may be exposed to oxygen plasma or ozone to render the surface thereof hydrophilic.

Next, as shown in FIGS. 9A and 9B, a first squeegee 804 is moved in the direction of an arrow 807 relative to the substrate 801 to apply water 805 onto the substrate 801. As a result, the water is disposed in the hydrophilic region 802. In these diagrams, the reference numeral 806 denotes the water that has been disposed in the hydrophilic region 802.

Then, as shown in FIGS. 10A to 10C, a second squeegee 808 is moved in the direction of an arrow 813 relative to the substrate 801 before the water 806 disposed in the hydrophilic region 802 volatilizes. Thus, a transistor-dispersed liquid 809 is applied to the substrate 801. In this transistor-dispersed liquid 809, a plurality of transistors 810 are dispersed in dichlorobutane 811.

The transistor 810 is described in detail below.

As shown in FIG. 12A, the transistor 810 is a rectangular parallelepiped. On one of the surfaces with the largest area, a gate electrode 902, a source electrode 903, and a drain electrode 904 are formed. The surface on which these electrodes 902 to 904 are formed is referred to as an electrode surface 901. Like ordinary transistors, the source electrode 903 and the drain electrode 904 have the same function. That is, the source electrode 903 may be used as a drain electrode. The drain electrode 904 may be used as a source electrode likewise.

The shape and size of the electrode surface 901 are the same as those of the hydrophilic region 802 shown in FIG. 12C. The shapes and sizes of the hydrophilic first electrode 906b, the hydrophilic second electrode 907b, and the hydrophilic third electrode 908b are the same as those of the gate electrode 902, the source electrode 903, and the drain electrode 904, respectively. Preferably, the material of these electrodes is palladium or nickel. An electrode having a multilayer structure with an outermost surface composed of palladium or nickel may also be used.

The surface of the transistor 810 is previously modified chemically with 1-chloroethyltrichlorosilane.

When this transistor-dispersed liquid 809 in which a plurality of such transistors 810 are dispersed in dichlorobutane 811 is applied onto the substrate 801, each of the transistors 810 moves from the dichlorobutane 811 to the water 806, as shown in FIGS. 10B and 10C. In FIG. 10C, the reference numeral 812 denotes the transistor that has moved into the water 806. The transistor 810 moves in this way because the water 806 and the dichlorobutane 811 have no compatibility with each other and the surface of the transistor 810 has been modified chemically with 1-chloroethyltrichlorosilane. Specifically, this chemical modification allows the transistor 810 to have higher wettability to the water 806 than that to the dichlorobutane 811. Accordingly, the transistor 810 moves from the dichlorobutane 811 with lower wettability to the water 806 with higher wettability. Since the water 806 and the dichlorobutane 811 have no compatibility with each other, even if the dichlorobutane 811 is applied onto the water 806, the water 806 stays there stably.

When the transistor 810 moves to the water 806, the following two cases are considered: the electrode surface 901 faces the hydrophilic region 802; and the surface 905 opposite to the electrode surface 901 faces the hydrophilic region 802. When the electrode surface 901 faces the hydrophilic region 802, the gate electrode 902, the source electrode 903, and the drain electrode 904 come into contact with the hydrophilic first electrode 906b, the hydrophilic second electrode 907b, and the hydrophilic third electrode 908b, respectively. In this way, the electrodes 902 to 904 of the transistor 810 are brought into physical contact respectively with the hydrophilic electrodes 906b to 908b formed on the substrate 801 to be connected electrically to the hydrophilic electrodes 906b to 908b. When the surface 905 opposite to the electrode surface 901 faces the hydrophilic region 802, a step of connecting the electrodes 902 to 904 of the transistor 810 respectively with the electrodes 906 to 908 formed on the substrate 801 is provided additionally.

Then, the water 806 is removed by volatilization. As a result, a transistor 814 is disposed in the hydrophilic region 802, as shown in FIGS. 11A and 11B. In these diagrams, the reference numeral 814 denotes the transistor that has been disposed in the hydrophilic region 802.

SUMMARY OF THE INVENTION

In the conventional method described in U.S. patent application Ser. No. 12/088,194, an electrical connection is established between the electrodes 902 to 904 of the transistor 810 and the hydrophilic electrodes 906b to 908b formed on the substrate 801 by a physical contact between these electrodes.

With this method, however, if there is even a small gap between the electrodes 902 to 904 of the transistor 810 and the hydrophilic electrodes 906b to 908b formed on the substrate 801, these electrodes are not connected electrically with each other. Therefore, strict control needs to be exercised over the smoothness of these electrodes, and strict control also needs to be exercised over the transistor-dispersed liquid to prevent the entrance of dust between these electrodes, which causes a problem that it is difficult to dispose the transistors at a high yield.

It is an object of the present invention to provide a method of disposing an electronic device typified by a transistor on an electrode formed on a substrate in order to ensure an electrical connection between an electrode of the electronic device and the electrode on the substrate.

The present invention is a method of disposing an electronic device on an electrode formed on a substrate to connect electrically the electronic device and the electrode. This method comprises the following steps:

a pre-step of preparing a substrate having on its surface a hydrophilic region surrounded by a water-repellent region, the hydrophilic region being provided with a hydrophilic electrode;

a first step of applying an electroless plating solution in which a metal compound is dispersed in water to the substrate to dispose the electroless plating solution in the hydrophilic region;

a second step of applying an electronic device-dispersed liquid in which an electronic device is dispersed in a first liquid to the substrate to move the electronic device from the first liquid to the electroless plating solution, the electronic device having a device electrode that is provided at a position corresponding to the hydrophilic electrode so as to come into contact with the hydrophilic electrode, the hydrophilic electrode being in contact with the device electrode, a surface of the electronic device having hydrophilicity, the first liquid being an organic solvent having no compatibility with the electroless plating solution, and one of surfaces of the electronic device that is to be bonded to the hydrophilic region having the same shape and size as those of the hydrophilic region;

a third step of coating a surface of the substrate with a second liquid before the water contained in the electroless plating solution volatilizes completely to cause a plating reaction between the hydrophilic electrode and the device electrode and to connect electrically the hydrophilic electrode and the device electrode, the second liquid being an organic solvent having no compatibility with the electroless plating solution; and a fourth step of removing the second liquid from the substrate.

The method of the present invention ensures an electrical connection between the electrode formed on the substrate and the electrode formed on a surface of the electronic device that faces the substrate. This allows a device on which a plurality of electronic devices are disposed to be fabricated at a high yield.

BRIEF DESCRIPTION OF THE DRAWINGS

FIGS. 12A and 12B are schematic diagrams of a transistor to be disposed by a conventional method, FIG. 12C is a schematic diagram of a hydrophilic region provided on a substrate and its vicinity, and FIG. 12D is a schematic diagram showing a state in which the transistor is disposed in the hydrophilic region.

DETAILED DESCRIPTION OF THE INVENTION

Figure 1C:
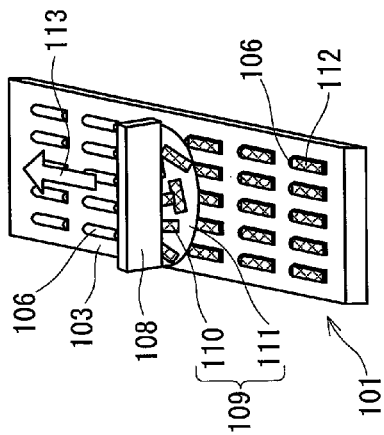
FIGS. 1A to 1F are schematic diagrams showing respective steps of a method of disposing an electronic device in an embodiment of the present invention.

The following will describe an embodiment of the present invention. In the drawings referred to in the description below, hatching may be omitted to facilitate understanding thereof. In the following description, the same reference numerals are used to designate the same elements and parts, and overlapping description thereof may be omitted.

FIGS. 1A to 1F show examples of a pre-step and first to fourth steps of the present invention.

Figure 2A:
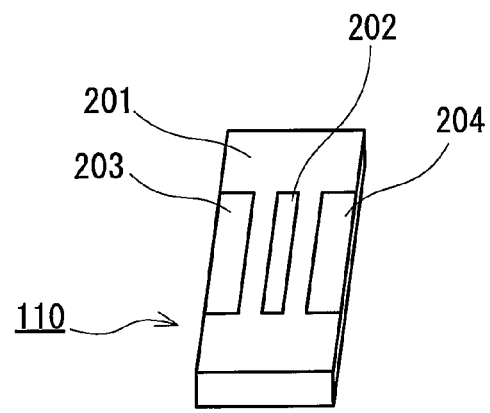
FIGS. 2A and 2B are schematic diagrams of a transistor to be disposed by the method of the embodiment of the present invention.
Figure 2B:
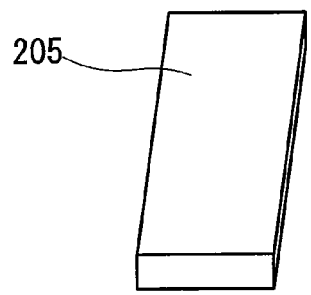

FIG. 2A is a schematic diagram of an electronic device to be disposed by a method of the present invention. In the present embodiment, a transistor 110 is used as an electronic device. The transistor 110 has on its electrode surface 201a gate electrode 202, a source electrode 203, and a drain electrode 204, as device electrodes. FIG. 2B shows a surface 205 of the transistor 110 opposite to the electrode surface 201. The transistor 110 has the same structure as the transistor 810 shown in FIG. 12A, and the gate electrode 202, the source electrode 203, and the drain electrode 204 correspond to the gate electrode 902, the source electrode 903, and the drain electrode 904, respectively. Therefore, a detailed description thereof is omitted here.

(Pre-Step)

Figure 1F:
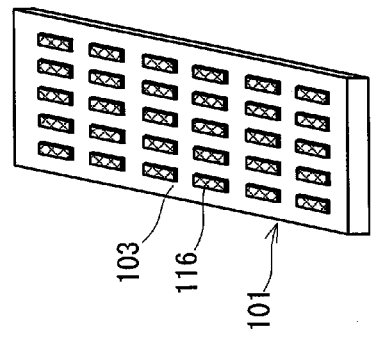
Figure 1B:
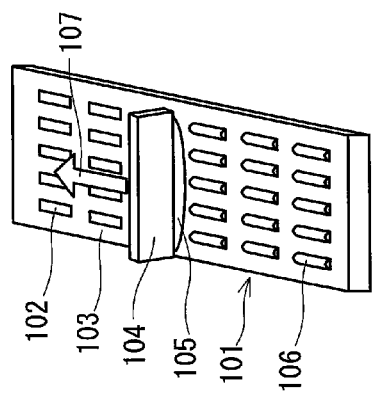
Figure 1E:
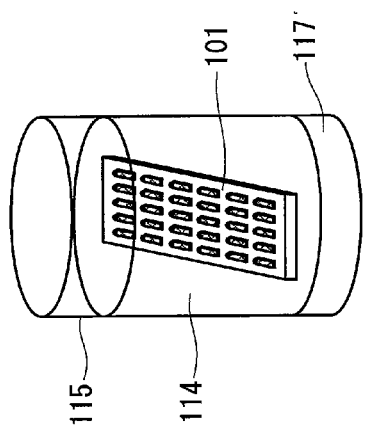
Figure 1A:
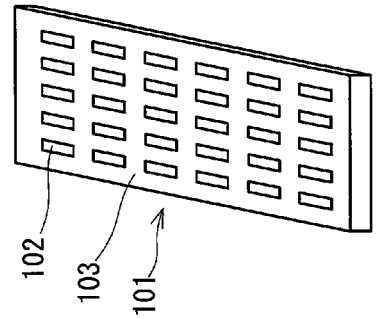
Figure 8A:
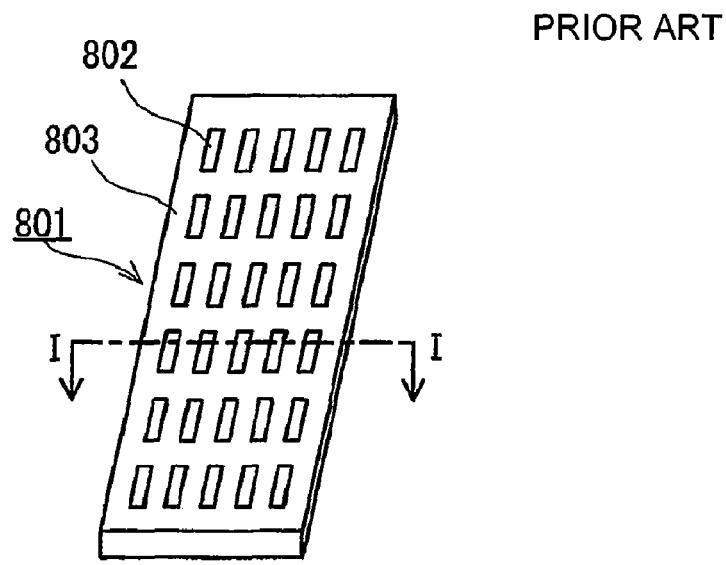
FIG. 8A is a schematic diagram showing a step of a conventional method of disposing transistors.
Figure 8B:
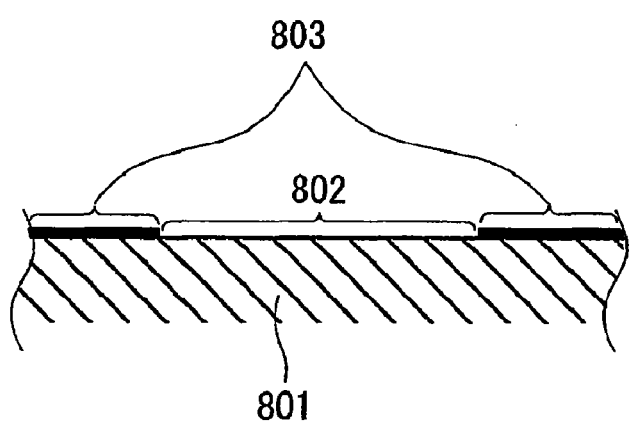
FIG. 8B is a cross-sectional view taken along a line I-I of FIG. 8A.
Figure 9A:
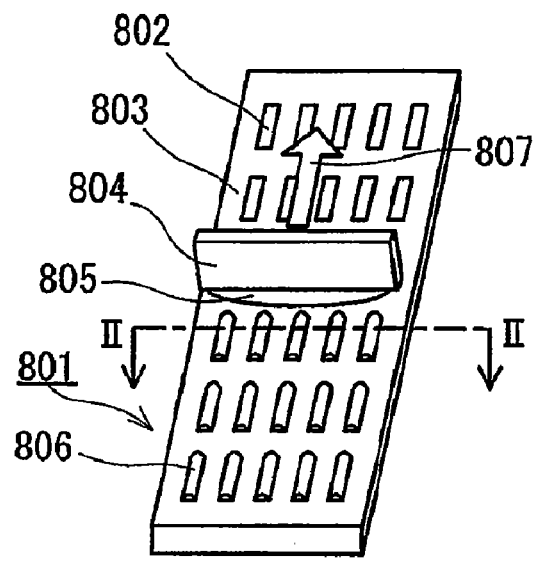
FIG. 9A is a schematic diagram showing a step of a conventional method of disposing transistors.
Figure 9B:
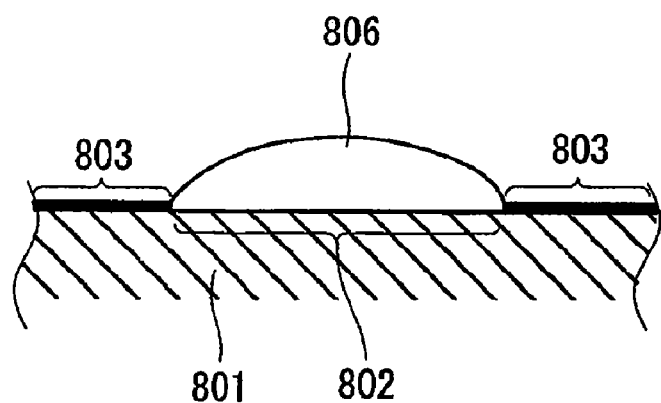
FIG. 9B is a cross-sectional view taken along a line II-II of FIG. 9A.
Figure 10A:
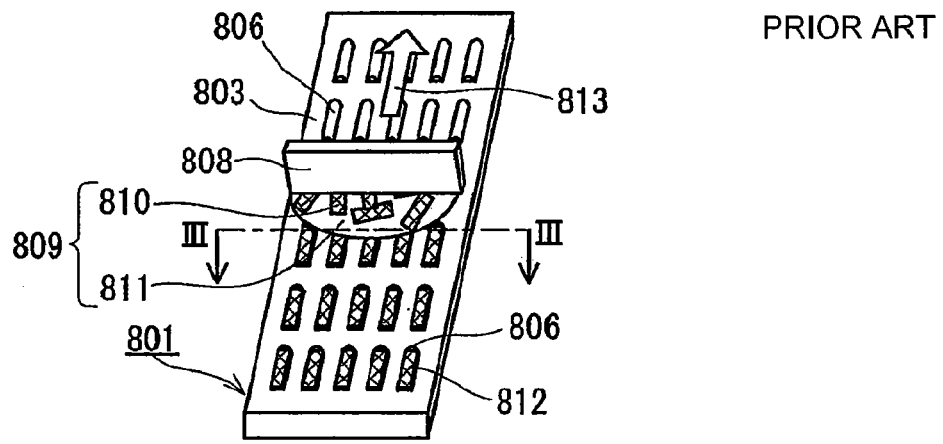
FIG. 10A is a schematic diagram showing a step of a conventional method of disposing transistors.
Figure 10B:
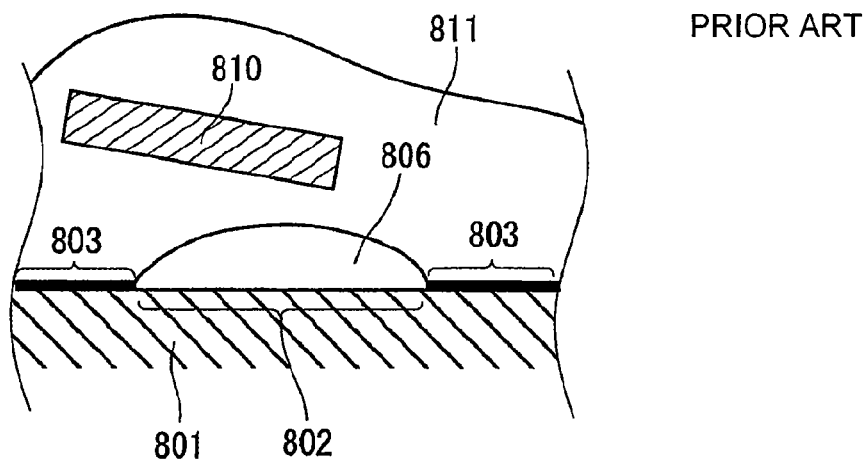
FIGS. 10B and 10C are cross-sectional views taken along a line III-III of FIG. 10A.
Figure 10C:
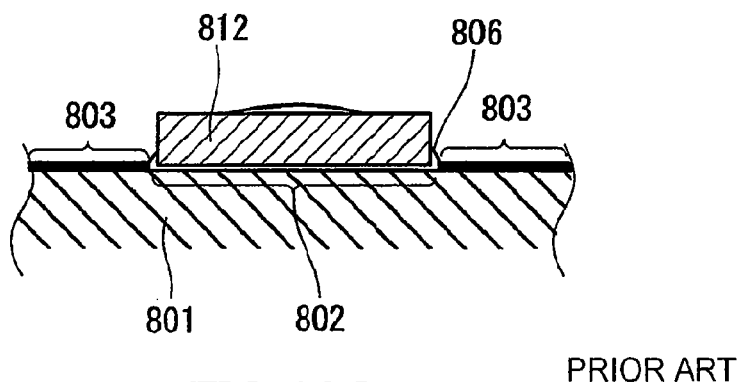
Figure 11A:
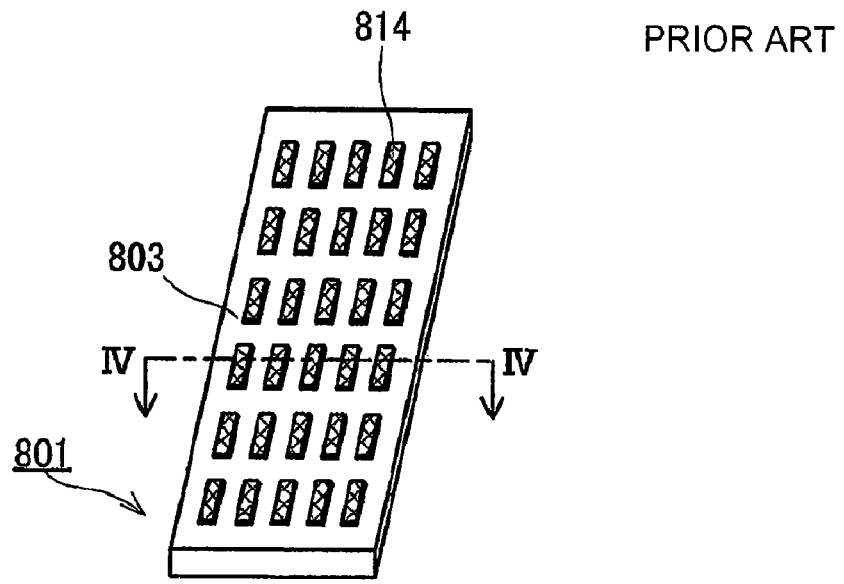
FIG. 11A is a schematic diagram showing a step of a conventional method of disposing transistors.
Figure 11B:
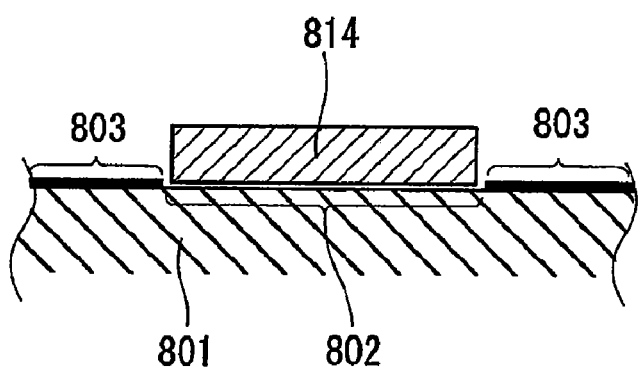
FIG. 11B is a cross-sectional view taken along a line IV-IV of FIG. 11A.

As shown in FIG. 1A, a substrate 101 having on its surface hydrophilic regions 102 that are arranged in a matrix and surrounded by a water-repellent region 103 is prepared. Since the substrate 101 is the same as the substrate 801 used in the conventional method that has been described with reference to FIGS. 8A and 8B, a detailed description of the substrate 101 is not repeated here. The hydrophilic region 102 and the water-repellent region 103 correspond to the hydrophilic region 802 and the water-repellent region 803, respectively.

In this specification, a "water-repellent surface" means a surface with a static contact angle of a pure water droplet left on the surface being 90 degrees or more. A "hydrophilic surface" means a surface with a static contact angle of a pure water droplet left on the surface being less than 90 degrees.

Figure 2C:
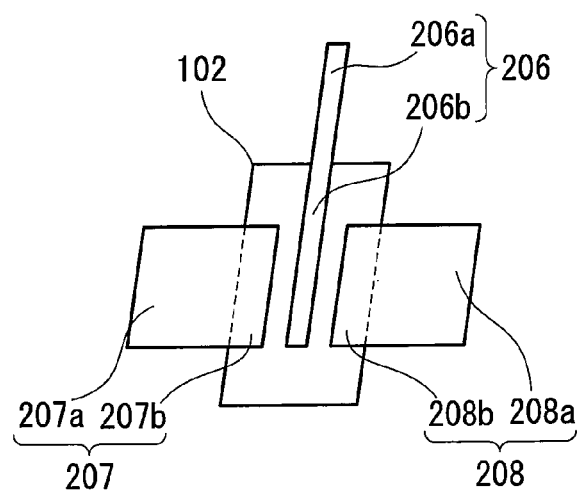
FIG. 2C is a schematic diagram of a hydrophilic region provided on a substrate and its vicinity.

FIG. 2C is a detailed schematic diagram of the hydrophilic region 102 to be formed on the substrate. The description of the hydrophilic region 102 is the same as that of the hydrophilic region 802 in the conventional method that has been made with reference to FIG. 12C. A first electrode 206, a second electrode 207, and a third electrode 208 are provided in and around the hydrophilic region 102. The first electrode 206, the second electrode 207, and the third electrode 208 are the same as the first electrode 906, the second electrode 907, and the third electrode 908 that have been described with reference to FIG. 12C. A water-repellent first electrode 206a and a hydrophilic first electrode 206b correspond to the water-repellent first electrode 906a and the hydrophilic first electrode 906b, respectively. A water-repellent second electrode 207a and a hydrophilic second electrode 207b correspond to the water-repellent second electrode 907a and the hydrophilic second electrode 907b, respectively. A water-repellent third electrode 208a and a hydrophilic third electrode 208b correspond to the water-repellent third electrode 908a and the hydrophilic second electrode 908b, respectively. Therefore, a detailed description of these electrodes is not repeated here.

(First Step)

In the first step, as shown in FIG. 1B, a first squeegee 104 is moved in the direction of an arrow 107 relative to the substrate 101 so as to apply an electroless plating solution 105 onto the substrate 101. As a result, an electroless plating solution 106 is disposed in the hydrophilic regions 102. In these diagrams, the reference numeral 105 denotes an electroless plating solution to be disposed in the hydrophilic regions 102, and the reference numeral 106 denotes an electroless plating solution that has been disposed in the hydrophilic regions 102.

In the electroless plating solution 105, a compound of a metal, such as nickel, cobalt, palladium, copper, silver, gold, platinum, and tin, is dispersed in water. In order to ensure a firm electrical connection between the electrodes 202 to 204 of the transistor 110 (see FIG. 2A) and the hydrophilic electrodes 206b to 208b on the substrate 101 (see FIG. 2C), an electroless plating solution containing nickel or copper is used preferably.

(Second Step)

In the second step, as shown in FIG. 1C, a second squeegee 108 is moved in the direction of an arrow 113 relative to the substrate 101 before the water contained in the electroless plating solution 106 that has been disposed in the hydrophilic regions 102 volatilizes. Thus, a transistor-dispersed liquid (electronic device-dispersed liquid) 109 is applied to the substrate 101. Even if the transistor-dispersed liquid 109 is applied after the water contained in the electroless plating solution 106 volatilizes, the electrodes 202 to 204 of the transistor 110 and the electrodes 206b to 208b on the substrate 101 are not connected electrically.

The transistor-dispersed liquid 109 is composed of the transistors 110 and a first liquid 111. As stated herein, the first liquid 111 is an organic solvent having no compatibility with the electroless plating solution 106. A preferable example of such an organic solvent is an organic solvent containing chlorine. Examples of the organic solvent containing chlorine include chloroform, chlorobutane, dichlorobutane, chloropentane, and dichloropentane.

The transistor-dispersed liquid 109 can be prepared in the same manner as in U.S. patent application Ser. No. 12/088, 194. How to prepare the transistor-dispersed liquid 109 is described below with reference to FIGS. 13A to 13D.

Figure 13B:
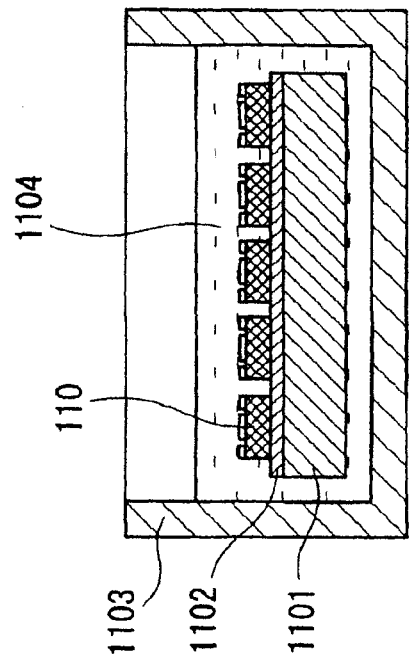
FIGS. 13A to 13D are schematic diagrams showing respective steps of a method of preparing an electronic device-dispersed liquid (transistor-dispersed liquid) in the embodiment of the present invention.
Figure 13D:
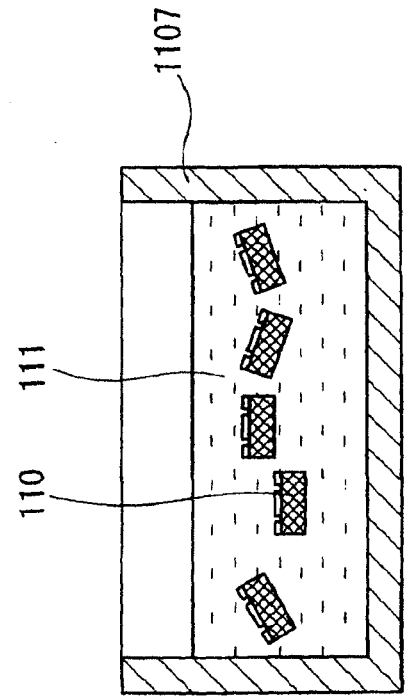
Figure 13A:
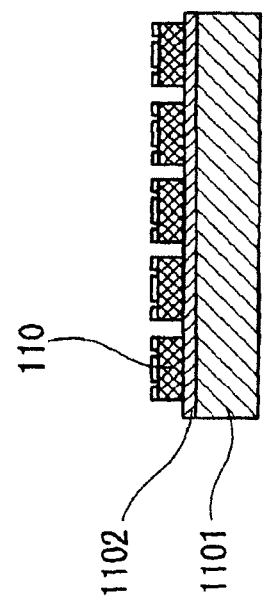

As shown in FIG. 13A, the transistors 110 are formed on a substrate 1101 via a sacrifice layer 1102. The transistors 110 can be fabricated in the same manner as in U.S. patent application Ser. No. 12/088,194.

Next, as shown in FIG. 13B, this substrate 1101 is immersed for about 30 minutes to one hour in an organic solvent 1104 in a container 1103. In the organic solvent 1104, 0.01 to 0.1 vol % of chemical modifier is dissolved. As a result, the surfaces of the transistors 110 are modified chemically to be rendered hydrophilic. The present inventor has known based on his experiences that the chemical modification under these conditions forms, on the surface of each of the transistors 110, a monomolecular film or a polymer film of a silane coupling agent with a large number of pinholes through which metal ions can pass. Examples of the chemical modifier include 1-chloroethyltrichlorosilane and 2-chloroethyltrichlorosilane.

Figure 13C:
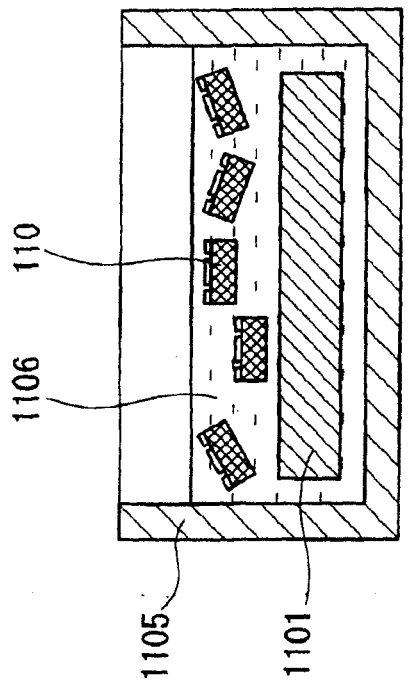

Then, the substrate 1101 is immersed in an etchant 1106 of the sacrifice layer in a container 1105 to remove the sacrifice layer 1102. As a result, as shown in FIG. 13C, the transistors 110 are dispersed in the etchant 1106.

Finally, the etchant 1106 is filtered through a Teflon (registered trademark) filter with a pore size of about 1 μm to recover the transistors 110 with chemically-modified surfaces. Then, as shown in FIG. 13D, the recovered transistors 110 are dispersed in the first liquid 111 in a container 1107.

The electrode surface 201 of the transistor 110 (see FIG. 2A) that has been modified chemically in this manner has higher wettability to the electroless plating solution 106 than that to the first liquid 111.

This difference in wettability causes the transistor 110 that has come close to the electroless plating solution 106 to move from the first liquid 111 to the electroless plating solution 106.

Figure 3A:
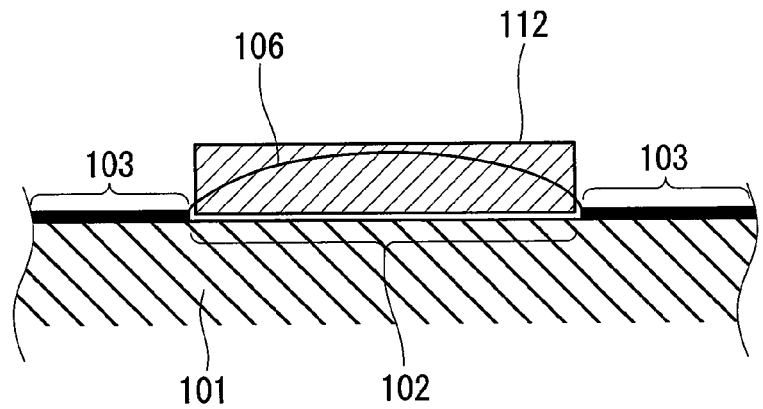
FIGS. 3A and 3B are schematic diagrams showing cross sections of a substrate and a transistor that has been disposed in a hydrophilic region of the substrate by the method of the embodiment of the present invention.

FIG. 3A is a schematic cross-sectional view of the substrate 101 and the transistor 112 that has moved to the electroless plating solution 106. A part of the transistor 112 is in contact with the electroless plating solution 106.

Figure 3B:
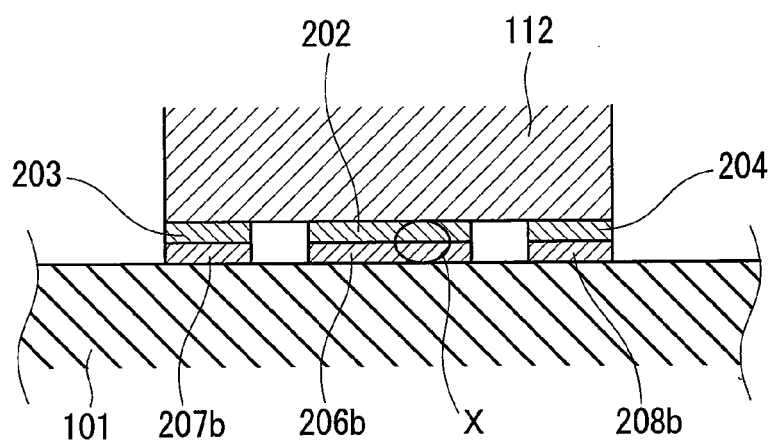

FIG. 3B is an enlarged view of the vicinity of the electrodes 202 to 204 of the transistor 112 and the electrodes 206b to 208b on the substrate 101. As shown in this diagram, the gate electrode 202, the source electrode 203, and the drain electrode 204 of the transistor 112 that has moved to the electroless plating solution 106 are in contact with the hydrophilic first electrode 206b, the hydrophilic second electrode 207b, and the hydrophilic third electrode 208b on the substrate 101, respectively.

Figure 1D:
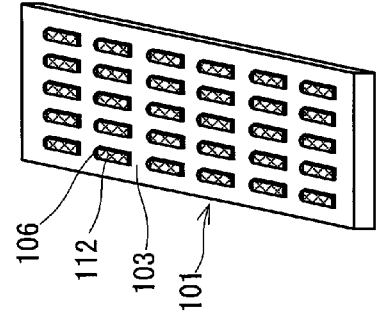

FIG. 1D is a schematic diagram of the substrate 101 obtained by applying the transistor-dispersed liquid 109 all over the substrate 101 with the second squeegee 108 in the step shown in FIG. 1C to dispose the transistors 112 in the hydrophilic regions 102.

(Third Step)

In the third step, as shown in FIG. 1E, the substrate 101 is immersed in the second liquid 114 in the container 115 before the water in the electroless plating solution 106 volatilizes completely. In FIG. 1E, the entire substrate 101 is immersed in the second liquid 114, but the surface of the substrate 101 may be coated with the second liquid 114. In the present embodiment, "immersing" is shown as an example of a form of "coating" in the third step.

The second liquid 114 is an organic solvent having no compatibility with the electroless plating solution 106. Therefore, even if the substrate 101 is immersed in the second liquid 114, the electroless plating solution 106 stays on the hydrophilic regions 102 stably.

Preferably, the second liquid 114 is insoluble in water. Specific examples of the second liquid 114 include alkane or alkyne having 6 to 16 carbon atoms, toluene, xylene, or a solvent containing a fluorocarbon chain.

In the second liquid 114, a plating reaction occurs between the electrodes 202 to 204 of the transistor 112 and the electrodes 206b to 208b on the substrate 101. As described above, a film of a silane coupling agent formed on the surface of the transistor 112 has a large number of pinholes through which metal ions can pass.

Therefore, the plating reaction causes a metal to deposit between the electrodes 202 to 204 formed on the transistor 112 and the electrodes 206b to 208b on the substrate 101. Since the electroless plating solution 106 is coated with the second liquid 114, the water in the electroless plating solution 106 does not volatilize. Accordingly, sufficient time for plating reaction can be secured to deposit a metal without changing significantly the state of the electroless plating solution 106 (such as the amount of water contained therein and the concentration of a metal compound therein). This allows a metal film to be formed between the electrodes 202 to 204 of the transistor 112 and the electrodes 206b to 208b on the substrate 101, which allows an electrical connection to be made between these electrodes.

As a result, the gate electrode 202, the source electrode 203, and the drain electrode 204 are connected electrically with the hydrophilic first electrode 206b, the hydrophilic second electrode 207b, and the hydrophilic third electrode 208b, respectively.

Preferably, the time in which the substrate 101 is immersed in (or coated with) the second liquid 114 is longer than the time required for the metal contained in the electroless plating solution 106 to deposit completely.

If the plating reaction is hard to occur at room temperature, the container 115 is heated by a heater 117.

A detailed process in which a plating reaction causes a metal to deposit to connect the electrodes 202 to 204 of the transistor 112 electrically with the electrodes 206b to 208b on the substrate 101 has not yet been well understood. The present inventor, however, presumes that the plating reaction proceeds through the following process.

Figure 3C:
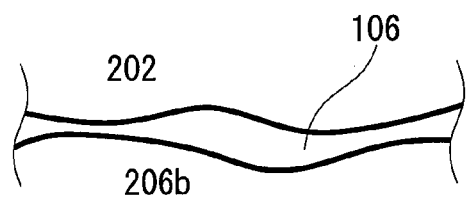
FIG. 3C is an enlarged schematic view of an X portion shown in FIG. 3B.

FIG. 3C is a schematic cross-sectional view of the vicinity X (see FIG. 3B) of the gate electrode 202 and the hydrophilic first electrode 206b. As shown in FIG. 3C, the gate electrode 202 is in physical contact with the hydrophilic electrode 206b on the substrate 101. However, since both of the surface of the gate electrode 202 and the surface of the hydrophilic electrode 206b on the substrate 101 are uneven, the electroless plating solution 106 is present between these electrodes 202 and 206b. A plating reaction occurs between these electrodes 202 and 206b, which produces an electrical connection therebetween. The other electrodes are also connected in the same process.

(Fourth Step)

In the fourth step, as shown in FIG. 1F, the substrate 101 is pulled out of the second liquid 114. When the substrate 101 is coated with the second liquid 114, the second liquid 114 is removed from the substrate 101. On removing the second liquid 114 in this fourth step, the remaining electroless plating solution 106 that has not served for the plating reaction in the third step is also removed from the substrate 101. In the fourth step, "pulling out" is shown as an example of a form of "removing".

In the foregoing description, a transistor is taken as an example of an electronic device, but it is needless to say that the present invention is not limited to this. The term "electronic device" used in this specification means not only a transistor but also a device such as a light emitting device, a diode, a capacitor, a resistor, or an optical sensor, that produces electrical input/output signals.

In the foregoing description, the shape of the transistor is a rectangular parallelepiped. As shown in FIGS. 2A to 2C, among the six surfaces of the transistor 110, the electrode surface 201 that is to be bonded to the hydrophilic region 102 is rectangular in shape, and each hydrophilic region 102 also is rectangular in shape. To put it generally, in the present invention, one of surfaces of the electronic device that is to come into contact with the hydrophilic region 102 has the same shape and size as those of the hydrophilic region 102.

In this specification, the phrase "having the same shape" means that the shape of one of the surfaces of the electronic device that is to come into contact with the hydrophilic region 102 and the shape of the hydrophilic region 102 are in a congruent or similar relationship in a mathematical sense.

In this specification, the phrase "having the same size" means that the value of the ratio S2/S1 is at least 0.64 but not more than 1.44 when S1 denotes the area of one of the surfaces of the electronic device that is to come into contact with the hydrophilic region 102 and S2 denotes the area of the hydrophilic region 102. Based on the present inventor's experiences, when the value of S2/S1 is less than 0.64, the amount of electroless plating solution to be disposed in the hydrophilic regions 102 is excessively small, and therefore the electronic devices 110 tend not to be disposed in the hydrophilic regions 102. On the other hand, when the value of S2/S1 exceeds 1.44, two or more electronic devices 110 are disposed in one hydrophilic region 102, which is not preferable.

Hereinafter, a specific example is shown. This example is used only for the purpose of illustration.

EXAMPLE

Method of Fabricating Model Electronic Device

In the present example, a nickel block of 100 μm×100 μm×30 μm was used as a model of an electronic device.

An aluminum film with a thickness of 200 nm was formed on a silicon wafer of 6 inches in diameter by electron beam evaporation. A pattern made of a resist film with a thickness of 50 μm was formed on the aluminum film. In this pattern, 100 μm square holes were arranged in a grid pattern at an interval of 20 μm. Next, the square holes were filled with nickel by electrolytic plating.

After peeling off the resist film, the nickel-plated film on the substrate was polished mechanically to obtain a 30 μm-thick nickel film having a surface with an average roughness of 0.3 μm. The substrate was put into a container containing a thermal phosphoric acid solution to remove the aluminum and detach the silicon wafer. Thus, a thermal phosphoric acid-dispersed liquid in which nickel blocks of 100 μm×100 μm×30 μm were dispersed was obtained. Next, this dispersion liquid was filtered through a Teflon (registered trademark) filter with a pore size of 10 μm to trap the nickel blocks on the filter.

(Method of Preparing Nickel Block-Dispersed Liquid)

The filter that had trapped the nickel blocks was dried overnight in a nitrogen atmosphere. Then, the filter that had trapped the nickel blocks was put into a container containing 1,4-dichlorobutane in which 0.01 vol % of 1-chloroethyltrichlorosilane was dissolved, and allowed to stand for one hour. This container was a closed container with a lid. The above-mentioned procedure was carried out in a glove box filled with dry nitrogen atmosphere.

Next, the container was pulled out of the glove box and placed in an ultrasonic washing machine so that the Teflon (registered trademark) filter was exposed to ultrasonic waves. As a result, the nickel blocks that had been modified chemically with 1-chloroethyltrichlorosilane were detached from the Teflon (registered trademark) filter and dispersed in the solution.

Next, the container was put into the glove box again, and the Teflon (registered trademark) filter was pulled out of the container. The liquid in the container was filtered through a separately prepared Teflon (registered trademark) filter with a pore size of 10 μm, and then this Teflon (registered trademark) filter was washed with 1,4-dichlorobutane. As a result, the chemically-modified nickel blocks were trapped on the Teflon (registered trademark) filter.

Next, the Teflon (registered trademark) filter was put into a container containing a 1,4-dichlorobutane solution. Then, the container was pulled out of the glove box and placed in an ultrasonic washing machine so that the Teflon (registered trademark) filter was exposed to ultrasonic waves. As a result, the chemically-modified nickel blocks that had been trapped on the Teflon (registered trademark) filter were dispersed in the solution.

(Electroless Plating Solution)

As an electroless plating solution, a copper electroless plating solution was used. The composition of the electroless plating solution was as follows:

Copper sulfate 0.96 g
Rochelle salt 7.5 g
Formaldehyde (37 wt % thereof was dissolved in methanol) 3 mL
Sodium hydroxide 2.1 g
Water 300 mL (Method of Fabricating Substrate)

As a substrate, a silicon wafer with a diameter of 4 inches and a thickness of 600 μm, having a silicon nitride film with a thickness of 200 nm on one of its surfaces, was used.

A resist film, in which 100 μm square holes were arranged in a grid pattern at an interval of 100 μm, was formed on this substrate by photolithography. A resist pattern for forming test metal electrodes was formed on the center of the substrate, as to be described later.

Next, a titanium film with a thickness of 10 nm and a palladium film with a thickness of 100 nm were formed in this order on the substrate by electron beam evaporation. Next, the resist was removed from the substrate. As a result, electrodes made of 100 μm square palladium pieces were arranged in a grid pattern at an interval of 100 μm on the substrate.

Figure 7A:
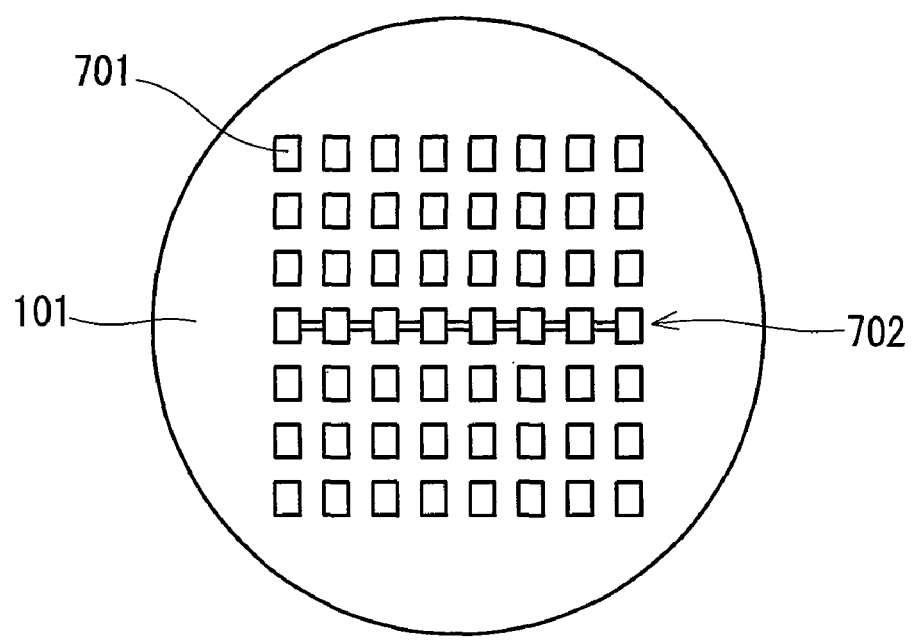
FIG. 7A is a schematic diagram showing a substrate on which nickel blocks as electronic devices are disposed in the example of the present invention.
Figure 7B:
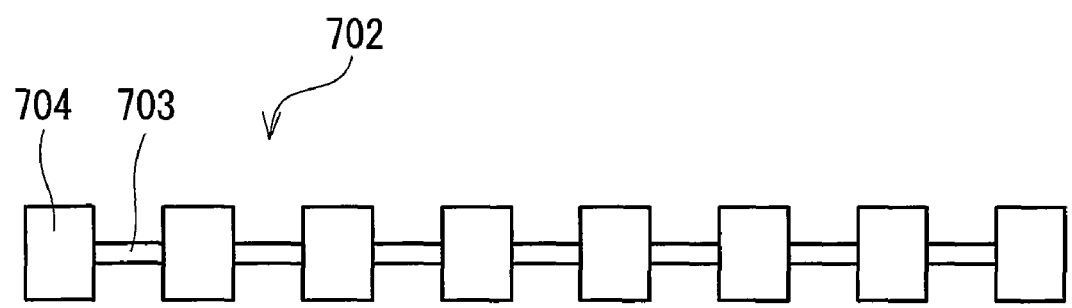
FIG. 7B is a schematic diagram showing a test electrode pattern provided on the substrate of FIG. 7A.

FIG. 7A shows a schematic diagram of the pattern of the metal electrodes thus formed. Electrode pattern elements 701 of 100 μm×100 μm and a test electrode pattern 702 are formed on the substrate. As shown in FIG. 7B, a transversely-aligned series of 100 μm square electrode pattern elements 704 are connected with each other via a metal wire 703 with a width of 20 μm so as to form the test electrode pattern 702.

The substrate was immersed for two hours in perfluorooctane in which 1 vol % of perfluorooctylethyltrichlorosilane ($CF_3(CF_2)_7C_2H_4SiCl_3$) was dissolved, taken out thereof, and washed while being swung in perfluorooctane. This procedure was carried out in a glove box filled with a dry nitrogen atmosphere.

Next, a photomask is brought into close contact with the substrate 101 and irradiated with vacuum ultraviolet light. Here, the positional relationship between the substrate 101 and the pattern of the photomask, including the test electrode pattern 702, is such that only the 100 μm square electrode pattern elements 701 and 704 are exposed to vacuum ultraviolet light.

As a result of this procedure, the square electrode pattern elements 701 and 704 having hydrophilicity and the water-repellent region that surrounds these electrode pattern elements are formed on the substrate 101.

(Nickel Block Disposition Experiment) (1))

FIGS. 6A to 6D are schematic cross-sectional views of an apparatus used to dispose nickel blocks in the present example. The container 115 had a cylindrical shape with a diameter of 40 cm and a height of 30 cm. As the second liquid 114, n-hexadecane was poured into the container 115. The level of n-hexadecane in the container 115 was 20 cm from the bottom thereof.

Figure 6A:
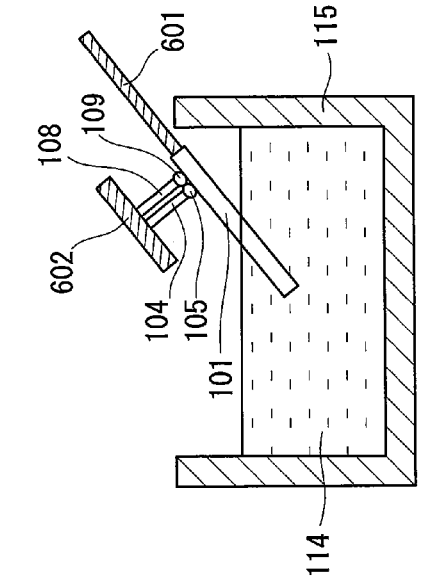
FIGS. 6A to 6D are schematic diagrams of an apparatus used to dispose nickel blocks as electronic devices in the example of the present invention.

As shown in FIG. 6A, the substrate 101 was placed obliquely above the container 115 using a jig 601 so that the surface of the substrate 101 was inclined by 45 degrees with respect to the horizontal direction. The jig 601 was coupled to a drive unit (not shown). The first squeegee 104 and the second squeegee 108 were fixed onto the substrate 101 using a jig 602.

Figure 5A:
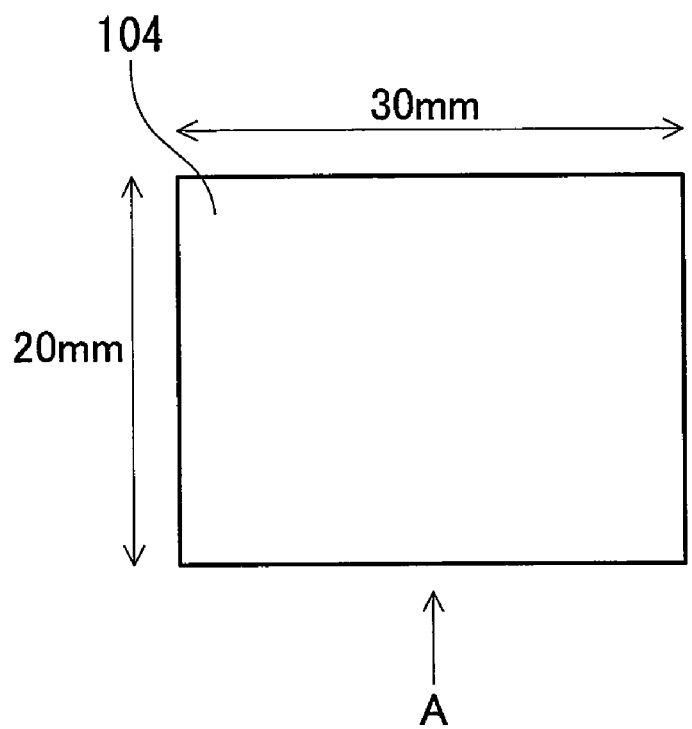
FIG. 5A is a schematic diagram showing a first squeegee to be used in the example of the present invention.
Figure 5B:
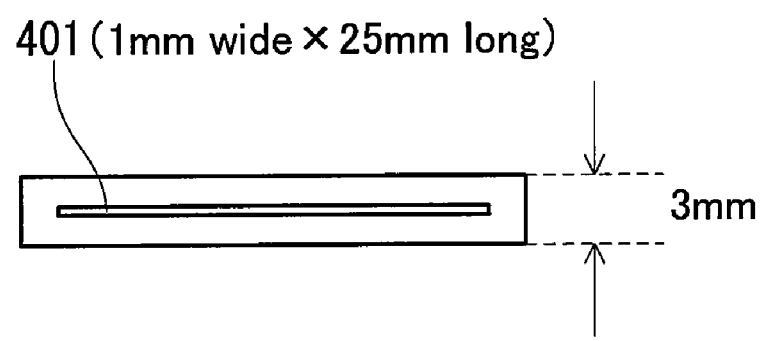
FIG. 5B is a schematic diagram of the first squeegee of FIG. 5A as viewed from an A direction.

FIG. 5A is a plan view of the first squeegee 104, and FIG. 5B is a view of the first squeegee 104 as seen from the direction A. As shown in FIG. 5A and FIG. 5B, the first squeegee 104 used in the present example is formed of a stainless steel plate of 30 mm wide, 20 mm high, and 3 mm thick having a slit 401 of 1 mm wide.

As the second squeegee 108, a glass plate 105 of 30 mm wide, 20 mm high, and 1 mm thick was used.

Figure 4:
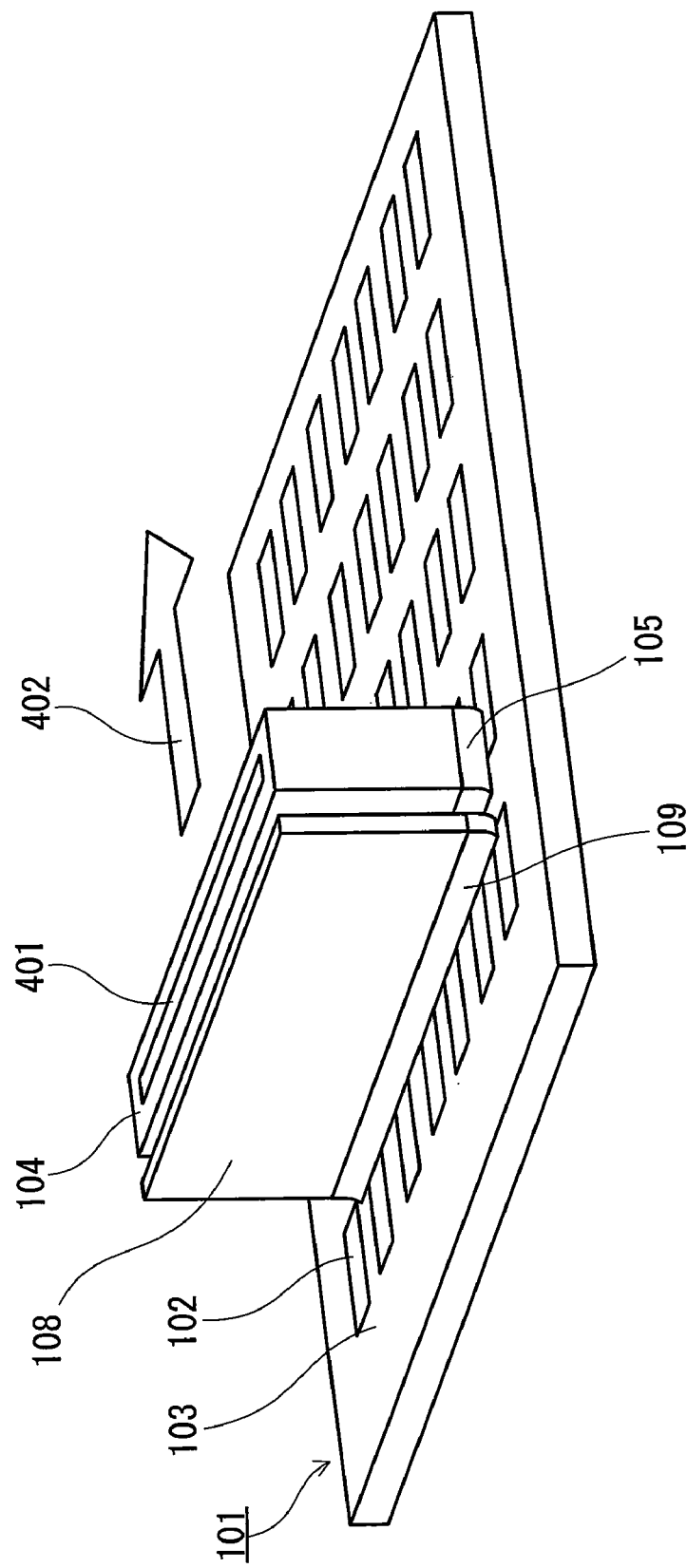
FIG. 4 is a schematic diagram showing a method of disposing electronic devices in an example of the present invention.

FIG. 4 is a schematic diagram showing the positional relationship among the substrate 101, the first squeegee 104, and the second squeegee 108. Both of the first squeegee 104 and the second squeegee 108 were moved in the direction of an arrow 402 relative to the substrate 101.

The first squeegee 104 and the second squeegee 108 that are spaced 1 mm apart were placed 0.2 mm above the substrate 101 using the jig 602.

Then, the copper electroless plating solution 105 was introduced into the slit 401 with a pipette to form a liquid film of the electroless plating solution 105 between the first squeegee 104 and the substrate 101. In the same manner, a liquid film of the nickel block dispersed-liquid 109 corresponding to an electronic device dispersed-liquid was formed with a pipette between the second squeegee 108 and the substrate 101.

Figure 6B:
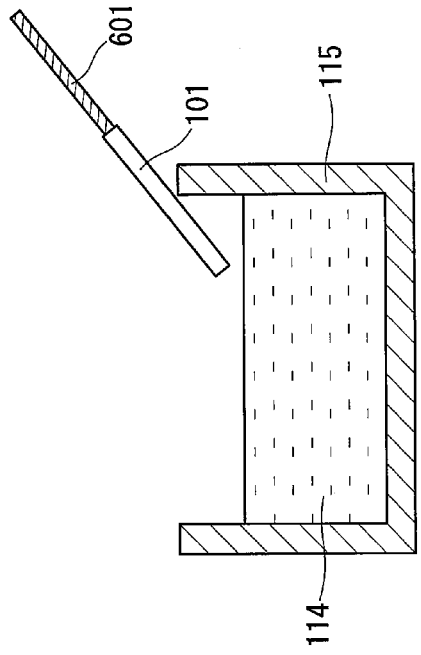

Then, as shown in FIG. 6B, the jig 601 was moved by this apparatus to immerse the substrate 101 entirely into the n-hexadecane 114 while maintaining the distance between the surface of the substrate 101 and the two squeegees 104 and 108 as well as the inclination of the substrate 101. The relative moving speed of the squeegees 104 and 108 to the substrate 101 was 10 cm/s.

Figure 6C:
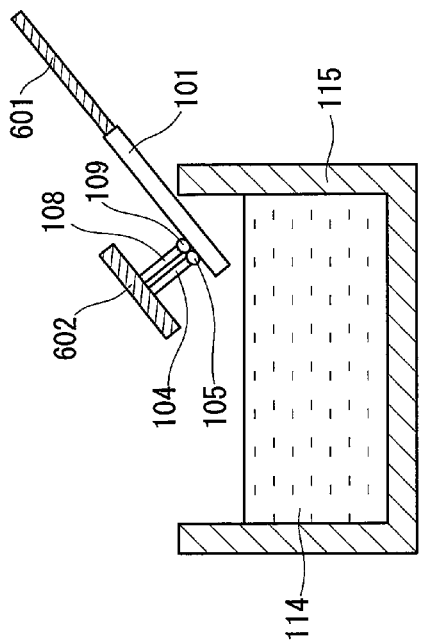

This procedure allowed the substrate 101, to which the electroless plating solution 105 and the nickel block dispersed-liquid 109 had been applied, to be immersed into the second liquid 114 (n-hexadecane) (see FIG. 6C).

Figure 6D:
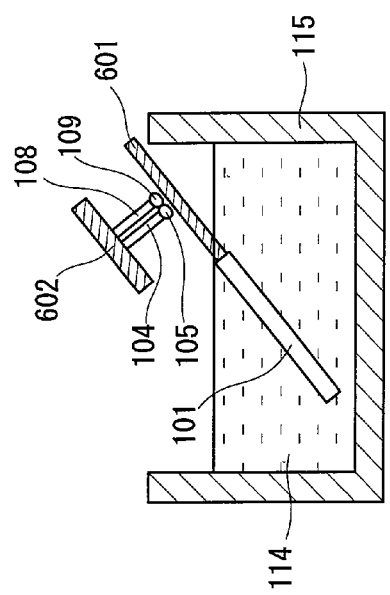

The substrate 101 was allowed to stand in n-hexadecane for 12 hours and then pulled out thereof (see FIG. 6D). Then, the number of model devices disposed within an arbitrarily selected area on the substrate 101 was counted and the counted number was determined as No. Next, the substrate 101 was washed while being swung in a container filled with ethanol and then pulled out of the container. The number of model devices in the same area that had been observed before the washing was counted, and the counted number was determined as N.

(Nickel Block Disposition Experiment) (2))

As a comparative experiment, the copper electroless plating solution and the dispersion liquid of the model devices were applied in the same manner as in the above-mentioned example except that the substrate was immersed in n-hexadecane. Subsequently, the substrate was allowed to stand in the atmosphere for 12 hours.

Then, the number of model devices disposed within an arbitrarily selected area on the substrate was counted and the counted number was determined as No. Next, the substrate was washed while being swung in a container filled with ethanol and then pulled out of the container. The number of model devices in the same area that had been observed before the washing was counted, and the counted number was determined as N.

(Evaluation of Substrate on which Nickel Blocks have been Disposed)

In the nickel block disposition experiment (1), the value of N/No was 0.9. Two of the nickel blocks disposed on the test electrode pattern elements 704 were selected as model devices.

The distance between the selected nickel blocks was 1 mm, and the 100 μm square test electrode pattern elements 704 below these nickel blocks were connected electrically to each other via the metal wire 703 with a width of 20 μm.

Probes were contacted to the two selected nickel blocks to measure the resistance value thereof. The measured resistance value was about 1 ohm.

These results show the following.

It is understood from the value of N/No of 0.9 that the disposed model devices were hardly removed from the substrate even if the substrate was washed while being swung in ethanol. It is therefore understood that the nickel blocks were bonded firmly to the electrode pattern elements 701 and 704 on the substrate.

Assuming that the nickel blocks are not connected electrically to the electrode pattern elements 701 and 704, it is predicted that little current flows between the two selected nickel block devices even if a voltage is applied therebetween with probes and the resistance values of the devices are the same as that of an insulator.

The measured resistance values, however, were about 1 ohm, so it can be said that the nickel blocks and the electrode pattern elements 701 and 704 were connected electrically with each other.

On the other hand, in the nickel block disposition experiment (2), the value of N/No was 0.1.

Also in the nickel block disposition experiment (2), the resistance values of the two selected nickel blocks were measured as in the nickel block disposition experiment (1). The measured resistance values were about 1 K ohm.

It is understood from the value of N/No of 0.1 that the nickel blocks were detached from the substrate by the washing in ethanol because they were not bonded firmly to the substrate. From the fact that the resistance values were three orders of magnitude higher than that in the nickel block disposition experiment (1), it is understood that the nickel blocks and the electrode pattern elements 701 and 704 were not connected electrically with each other.

These results show that the method of the present invention allows the nickel blocks not only to be disposed on the substrate and but also to be connected electrically to the substrate.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The method of the present invention for disposing an electronic device on an electrode formed on a substrate to connect electrically the electronic device and the electrode can be used for the manufacture of transistors and light emitting devices for displays if such transistors and light emitting devices are used as electronic devices in the method.

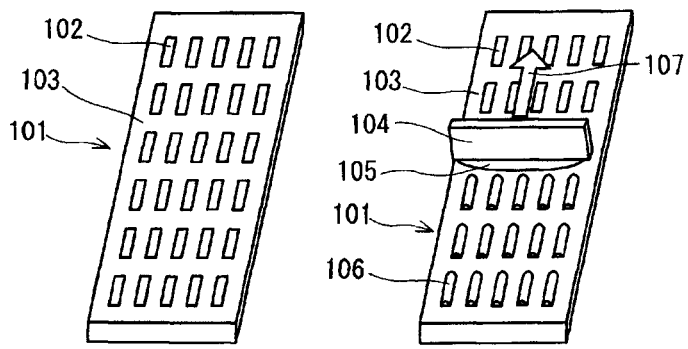

What is claimed is:

1. A method of disposing an electronic device on an electrode formed on a substrate to connect electrically the electronic device and the electrode, the method comprising:
    a pre-step of preparing a substrate having on a surface on which a hydrophilic region surrounded by a water-repellent region, the hydrophilic region being provided with a hydrophilic electrode;
    a first step of applying an electroless plating solution in which a metal compound is dispersed in water to the substrate to dispose the electroless plating solution in the hydrophilic region;
    a second step of applying an electronic device-dispersed liquid in which an electronic device is dispersed in a first liquid to the substrate to move the electronic device from the first liquid to the electroless plating solution, the electronic device having a device electrode that is provided at a position corresponding to the hydrophilic electrode so as to come into contact with the hydrophilic electrode, the hydrophilic electrode being in contact with the device electrode, a surface of the electronic device having hydrophilicity, the first liquid being an organic solvent having no compatibility with the electroless plating solution, and one of surfaces of the electronic device that is to be bonded to the hydrophilic region having the same shape and size as the hydrophilic region of the substrate;
    a third step of coating a surface of the substrate with a second liquid before the water contained in the electroless plating solution volatilizes completely to cause a plating reaction between the hydrophilic electrode and the device electrode and to connect electrically the hydrophilic electrode and the device electrode, the second liquid being an organic solvent having no compatibility with the electroless plating solution; and
    a fourth step of removing the second liquid from the substrate.

2. The method according to claim 1, wherein in the third step, the substrate is immersed in the second liquid to coat the surface of the substrate with the second liquid.

3. The method according to claim 2, wherein in the fourth step, the substrate that has been immersed in the second liquid is pulled out of the second liquid to remove the second liquid from the substrate.

4. The method according to claim 1, wherein the first liquid is an organic solvent containing chlorine.

5. The method according to claim 4, wherein the organic solvent is chloroform, chlorobutane, dichlorobutane, chloropentane, or dichloropentane.

6. The method according to claim 1, wherein the second liquid is insoluble in water.

7. The method according to claim 6, wherein the second liquid is alkane or alkyne having 6 to 16 carbon atoms, toluene, xylene, or a solvent containing a fluorocarbon chain.

8. The method according to claim 1, wherein the first liquid is an organic solvent containing chlorine, and the second liquid is insoluble in water.

9. The method according to claim 8, wherein the organic solvent is chloroform, chlorobutane, dichlorobutane, chloropentane, or dichloropentane.

10. The method according to claim 8, wherein the second liquid is alkane or alkyne having 6 to 16 carbon atoms, toluene, xylene, or a solvent containing a fluorocarbon chain.

11. The method according to claim 8, wherein the organic solvent is chloroform, chlorobutane, dichlorobutane, chloropentane, or dichloropentane, and the second liquid is alkane or alkyne having 6 to 16 carbon atoms, toluene, xylene, or a solvent containing a fluorocarbon chain.

12. The method according to claim 1, wherein the surface of the electronic device comprises with a monomolecular film or a polymer film of a silane coupling agent.

13. The method according to claim 12, wherein the monomolecular film or the polymer film comprises a plurality of pinholes.

14. The method according to claim 12, wherein the silane coupling agent is composed of 1-chloroethyl-trichlorosilane or 2-chloroethyl-trichlorosilane.

* * * * *

UNITED STATES PATENT AND TRADEMARK OFFICE
CERTIFICATE OF CORRECTION

| | | |
|---|---|---|
| PATENT NO. | : 7,814,648 B2 | Page 1 of 1 |
| APPLICATION NO. | : 12/761911 | |
| DATED | : October 19, 2010 | |
| INVENTOR(S) | : Tohru Nakagawa | |

It is certified that error appears in the above-identified patent and that said Letters Patent is hereby corrected as shown below:

IN THE CLAIMS:

In Column 13, Line 33 (Claim 1), please change "device that is to be "bonded" to --device to be bonded.--.

Signed and Sealed this
Nineteenth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,814,648 B2 | |
| APPLICATION NO. | : 12/761911 | |
| DATED | : October 19, 2010 | |
| INVENTOR(S) | : Tohru Nakagawa | |

It is certified that error appears in the above-identified patent and that said Letters Patent is hereby corrected as shown below:

Delete Title Page, replace with new Title Page. (attached)

IN THE DRAWINGS:

Please insert Sheet 13 of 13 containing Figures 13 A-D with the drawing sheet attached.

Signed and Sealed this
Tenth Day of May, 2011

David J. Kappos
*Director of the United States Patent and Trademark Office*

(12) United States Patent
Nakagawa

(10) Patent No.: US 7,814,648 B2
(45) Date of Patent: Oct. 19, 2010

(54) METHOD OF DISPOSING AN ELECTRONIC DEVICE ON AN ELECTRODE FORMED ON SUBSTRATE

(75) Inventor: Tohru Nakagawa, Shiga (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/761,911

(22) Filed: Apr. 16, 2010

(65) Prior Publication Data

US 2010/0192372 A1 Aug. 5, 2010

Related U.S. Application Data

(63) Continuation of application No. PCT/JP2009/005456, filed on Oct. 19, 2009.

(30) Foreign Application Priority Data

Nov. 26, 2008 (JP) ............................. 2008-300481

(51) Int. Cl.
*H05K 3/30* (2006.01)
(52) U.S. Cl. ..................... 29/832; 29/831; 29/842; 29/846; 427/97.3; 438/678
(58) Field of Classification Search ............ 29/831, 29/832, 834, 842, 846; 101/465; 427/97.3, 427/97.4, 98.4, 273, 430.1; 438/99, 107, 438/377, 678
See application file for complete search history.

(56) References Cited

U.S. PATENT DOCUMENTS 5,079,600 A * 1/1992 Schnur et al. ............... 438/669

(Continued)

FOREIGN PATENT DOCUMENTS

CN 101310373 11/2008

(Continued)

OTHER PUBLICATIONS

Tohru Nakagawa, et al., "Controlled Deposition of Silicon Nanowires on Chemically Patterned Substrate by Capillary Force Using a Blade-Coating Method", J. Phys. Chem, 2008, No. 112, pp. 5390-5396, American Chemical Society.

(Continued)

*Primary Examiner*—Donghai D. Nguyen
(74) *Attorney, Agent, or Firm*—McDermott Will & Emery LLP

(57) ABSTRACT

The present invention includes: a pre-step of preparing a substrate having on its surface a hydrophilic region that is surrounded by a water-repellent region and provided with a hydrophilic electrode; a first step of applying an electroless plating solution in which a metal compound is dispersed in water to the substrate to dispose an electroless plating solution in the hydrophilic region; a second step of applying an electronic device-dispersed liquid in which an electronic device having a device electrode is dispersed in a first liquid to the substrate to move the electronic device from the first liquid to the electroless plating solution so as to bring the device electrode into contact with the hydrophilic electrode; a third step of coating a surface of the substrate with a second liquid before the water contained in the electroless plating solution volatilizes completely to cause a plating reaction between the hydrophilic electrode and the device electrode and to connect electrically the hydrophilic electrode and the device electrode; and a fourth step of removing the second liquid from the substrate.

14 Claims, 13 Drawings Sheets